United States Patent
McGaughy et al.

(10) Patent No.: US 7,373,289 B2
(45) Date of Patent: May 13, 2008

(54) ELECTRICAL ISOMORPHISM

(75) Inventors: Bruce W. McGaughy, Fremont, CA (US); Wai Chung William Au, San Jose, CA (US); Baolin Yang, Fremont, CA (US)

(73) Assignee: Cadence Design Systems, Inc, San Jose, CA (US)

( * ) Notice: Subject to any disclaimer, the term of this patent is extended or adjusted under 35 U.S.C. 154(b) by 296 days.

(21) Appl. No.: 10/993,687

(22) Filed: Nov. 19, 2004

(65) Prior Publication Data

US 2006/0111884 A1    May 25, 2006

(51) Int. Cl.
*G06F 17/50* (2006.01)
(52) U.S. Cl. ........................................ 703/14
(58) Field of Classification Search ............... 703/14
See application file for complete search history.

(56) References Cited

U.S. PATENT DOCUMENTS

| | | | |
|---|---|---|---|
| 5,313,398 A * | 5/1994 | Rohrer et al. | 703/14 |
| 5,446,676 A | 8/1995 | Huang et al. | |
| 5,553,008 A | 9/1996 | Huang et al. | |
| 6,031,986 A * | 2/2000 | Milsom | 703/14 |
| 6,086,626 A * | 7/2000 | Jain et al. | 716/5 |
| 6,577,992 B1 * | 6/2003 | Tcherniaev et al. | 703/14 |
| 6,665,845 B1 | 12/2003 | Aingaran et al. | |
| 7,024,652 B1 * | 4/2006 | McGaughy et al. | 716/12 |
| 7,181,383 B1 * | 2/2007 | McGaughy et al. | 703/14 |
| 2005/0165595 A1 * | 7/2005 | Teig et al. | 703/14 |

OTHER PUBLICATIONS

Webster's II New Riverside University Dictionary, 1994, Houghton Mifflin Company, pp. 646-647.*
Celestry Design Technologies, Inc. (2001). *Celestry BSIM Pro+™ Basic Operations*, User Manual, Version 2001.3, Table of Contents, pp. iii-xiii.
Celestry Design Technologies, Inc. (2001). *Celestry BSIM Pro+™ Device Modeling Guide*, User Manual, Version 2001.3, Table of Contents, pp. iii-xii.
Feldman, P. et al. (May 1995). "Efficient Linear Circuit Analysis by Pade Approximation via Lanczos Process," *IEEE Transactions on CAD*, 14(5):639-649.

(Continued)

*Primary Examiner*—Ngoc-Yen Vu
*Assistant Examiner*—James A Meyers
(74) *Attorney, Agent, or Firm*—Wheelock Chan LLP; Thomas Chan

(57) ABSTRACT

Method and system for determining electrical isomorphism between two electrical networks are disclosed. In one embodiment, the method includes representing the circuit as a hierarchically-arranged set of branches. The hierarchically-arranged set of branches including a first branch that includes a first electrical network and a second branch that includes a second electrical network, where the first and second branches are interconnected in the graph through a third branch at a higher hierarchical level in the graph than the first and second branches. Next, the method determines whether the first and second electrical networks are electrically isomorphic networks. If the first and second electrical networks are determined to be electrically isomorphic networks, the first and second electrical networks are represented with a single electrically isomorphic network. The method further includes simulating the first and second electrical networks using the single electrically isomorphic network.

24 Claims, 3 Drawing Sheets

OTHER PUBLICATIONS

Kerns, K. et al. (1996). "Stable and Efficient Reduction of Large Multiport RC Networks by Pole Analysis via Congruence Transformations," *IEEE/ACM DAC*, pp. 280-285.

Pillage, L.T. et al. (Apr. 1990). "Asymptotic Waveform Evaluation for Timing Analysis," *IEEE Transactions on CAD*, 9(4):352-366.

U.S. Appl. No. 10/724,277, filed Nov. 26, 2003, by McGaughy et al.

U.S. Appl. No. 10/993,686, filed Nov. 19, 2004 by McGaughy et al.

Van der Spiegel, J. (1995). "SPICE—A Brief Overview," located at http://www.seas.upenn.edu/~jan/spice/spice.overview.html, last visited on Mar. 8, 2005, 19 pages.

\* cited by examiner

ELECTRICAL ISOMORPHISM

RELATED APPLICATIONS

This application is related to the following application, which is commonly owned by Cadence Design Systems, Inc. and is filed on the same date as this application, and is hereby incorporated by reference in its entirety: System and Method for Converting a Flat Netlist into a Hierarchical Netlist.

FIELD OF THE INVENTION

The present invention relates to the field of electronic design automation tools. In particular, the present invention relates to a method and system for determining electrical isomorphism between two electrical networks.

BACKGROUND OF THE INVENTION

The development of complicated integrated circuits often requires powerful numerical simulation programs. For example, circuit simulation is an essential part in the design flow of integrated circuits, helping circuit designers to verify the functionality and performance of their designs without going through expensive fabrication processes. Examples of electronic circuit simulators include the Simulation Program with Integrated Circuit Emphasis (SPICE) developed at the University of California, Berkeley (UC Berkeley), and various enhanced versions or derivatives of SPICE, such as SPECTRE, developed by Cadence Design Systems, Inc. SPICE and its derivatives or enhanced versions will be referred to hereafter as SPICE circuit simulators, or SPICE.

An integrated circuit is a network of circuit elements such as resistors, capacitors, inductors, mutual inductors, transmission lines, diodes, bipolar junction transistors (BJT), junction field effect transistors (JFET), metal-oxide-semiconductor field effect transistors (MOSFET), metal-semiconductor field effect transistors (MESFET), thin-film transistors (TFT), etc. SPICE models a circuit in a node/element fashion, i.e., the circuit is regarded as a collection of various circuit elements connected at nodes. At the heart of SPICE is the so-called Nodal Analysis, which is accomplished by formulating nodal equations (or circuit equations) in matrix format to represent the circuit and by solving these nodal equations. The circuit elements are modeled by device models, which produce model results that are represented in the circuit equations as matrices.

A device model for modeling a circuit element, such as the SPICE model for modeling MOSFET devices, developed by UC Berkeley, typically includes model equations and a set of model parameters that mathematically represent characteristics of the circuit element under various bias conditions. For example, a circuit element with n terminals can be modeled by the following current-voltage relations:

$I_i = f_i(V_1, \ldots, V_n, t)$ for $i=1, \ldots, n,$ where $I_i$ represents the current entering terminal I; $V_j$ (j=1, ..., n) represents the voltage or terminal bias across terminal j and a reference terminal, such as the ground; and t represents the time. The Kirchhoff's Current Law implies that the current entering terminal n is given by $$I_n = \sum_{i=1}^{n-1} I_i.$$

A conductance matrix of the circuit element is defined by:

$$G(V_1, \ldots, V_n, t) := \begin{pmatrix} \frac{\partial f_1}{\partial V_1} & \cdots & \frac{\partial f_1}{\partial V_n} \\ \vdots & \ddots & \vdots \\ \frac{\partial f_n}{\partial V_1} & \cdots & \frac{\partial f_n}{\partial V_n} \end{pmatrix}.$$

To model the circuit element under alternating current (AC) operations, the device model also considers the relationship between node charges and the terminal biases:

$Q_i = q_i(V_1, \ldots, V_n, t)$ for $i=1, \ldots, n.$ where $Q_i$ represents the node charge at terminal i. Thus, the capacitance matrix of the n-terminal circuit element is defined by $$C(V_1, \ldots, V_n, t) := \begin{pmatrix} \frac{\partial q_1}{\partial V_1} & \cdots & \frac{\partial q_1}{\partial V_n} \\ \vdots & \ddots & \vdots \\ \frac{\partial q_n}{\partial V_1} & \cdots & \frac{\partial q_n}{\partial V_n} \end{pmatrix}.$$

A complex integrated circuit may contain millions of circuit elements such as transistors, resistors, and capacitors. The design and simulation of such a complex integrated circuit may involve multiple teams of engineers. It is advantageous to partition the design of such complex integrated circuit using a hierarchical approach, whereby certain circuit elements are grouped together and may be reused repeatedly through the integrated circuit or in a subsequent design. A method and system for design and simulation of an integrated circuit with a hierarchical data structure are disclosed by U.S. patent application Ser. No. 10/724,277, entitled "System and Method for Simulating a Circuit Having Hierarchical Structure," which, filed on Nov. 26, 2003 and commonly owned by Cadence Design Systems, Inc., is incorporated expressly by reference in its entirety herein.

Hierarchical simulation is most useful when it can also be applied to simulate a back-annotated flat netlist containing parasitic RC networks. During back-annotation, a flat netlist in DSPF (Detailed Standard Parasitic Format) or SPEF (Standard Parasitic Exchange Format) that consists of millions of RC elements is produced by a process called Parasitic Extraction. The flat netlist is also referred to as a gate-level netlist.

Prior-art circuit simulators simulate a back-annotated circuit as a flat circuit. After reading in the flat netlist, the circuit simulators perform a process known as the RC Reduction on a net by net basis to reduce the number of RC elements within a particular RC network in the flat netlist. Various techniques for performing RC Reduction are described in "Asymptotic waveform evaluation for timing analysis," by L. Pillage and R. Rohrer in *IEEE Transactions on CAD*, vol. 9, no. 4, pp. 352-366, April 1990; "Efficient Linear Circuit Analysis by Pade Approximation via Lanczos Process," by P. Feldmann and R. Freund in *IEEE Transactions on CAD*, vol. 14, no. 5, pp. 639-649, May 1995; and "Stable and Efficient Reduction of Large Multiport RC Networks by Pole Analysis via Congruence Transformations," by K. Kerns and A. Yang in *IEEE/ACM DAC*, pp. 280-285, 1996.

However, after the RC Reduction process, the prior-art circuit simulators simulate the design using the flat netlist. As a result, the performance of the simulation suffers significantly because of the large number of circuit elements, such as the back-annotated parasitic resistors and capacitors that have to be simulated. Additionally, simulating the flat netlist requires more memory because of the large number of circuit elements of the back-annotated flat netlist.

Therefore, methods and systems for determining electrical isomorphism between two electrical networks are needed for improving the efficiency of simulating an integrated circuit with its parasitic RC networks after back-annotation.

SUMMARY

Electrical isomorphism is a process of identifying electrical networks that are electrically equivalent though they may differ topologically. In one embodiment, a method for simulating a circuit having a hierarchical data structure includes representing the circuit as a hierarchically-arranged set of branches, which includes a root branch and a plurality of other branches logically organized in a graph. The hierarchically-arranged set of branches includes a first branch that includes a first electrical network and a second branch that includes a second electrical network, where the first and second branches are interconnected in the graph through a third branch at a higher hierarchical level in the graph than the first and second branches. Next, the method determines whether the first and second electrical networks are electrically isomorphic networks. If the first and second electrical networks are determined to be electrically isomorphic networks, the first and second electrical networks are represented with a single electrically isomorphic network. The method further includes simulating the first and second electrical networks using the single electrically isomorphic network.

In another embodiment, a system for simulating a circuit having a hierarchical data structure includes at least one processing unit for executing computer programs, a graphical-user-interface for viewing representations of the integrated circuit on a display, and a memory for storing information of the integrated circuit. In addition, the system includes means for representing the circuit as a hierarchically-arranged set of branches, which includes a root branch and a plurality of other branches logically organized in a graph. The hierarchically-arranged set of branches includes a first branch that includes a first electrical network and a second branch that includes a second electrical network, where the first and second branches are interconnected in the graph through a third branch at a higher hierarchical level in the graph than the first and second branches. The system also includes means for determining whether the first and second electrical networks are electrically isomorphic networks. If the first and second electrical networks are determined to be electrically isomorphic networks, the first and second electrical networks are represented with a single electrically isomorphic network. The system further includes means for simulating the first and second electrical networks using the single electrically isomorphic network.

In yet another embodiment, a computer program product comprising medium storing programs for execution by one or more computer systems includes an electrical isomorphism module for identifying electrically isomorphic networks, where the electrical isomorphism module is used in conjunction with at least a microprocessor unit, a memory, and a user interface. The electrical isomorphism module includes one or more computer programs containing instructions for representing the circuit as a hierarchically-arranged set of branches, which includes a root branch and a plurality of other branches logically organized in a graph. The hierarchically-arranged set of branches includes a first branch that includes a first electrical network and a second branch that includes a second electrical network, where the first and second branches are interconnected in the graph through a third branch at a higher hierarchical level in the graph than the first and second branches. The electrical isomorphism module also includes instructions for determining whether the first and second electrical networks are electrically isomorphic networks. If the first and second electrical networks are determined to be electrically isomorphic networks, the first and second electrical networks are represented with a single electrically isomorphic network. The electrical isomorphism module further includes instructions for simulating the first and second electrical networks using the single electrically isomorphic network.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

DESCRIPTION OF EMBODIMENTS

Methods and systems are provided for determining electrical isomorphism between two electrical networks of an integrated circuit. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Figure 1:
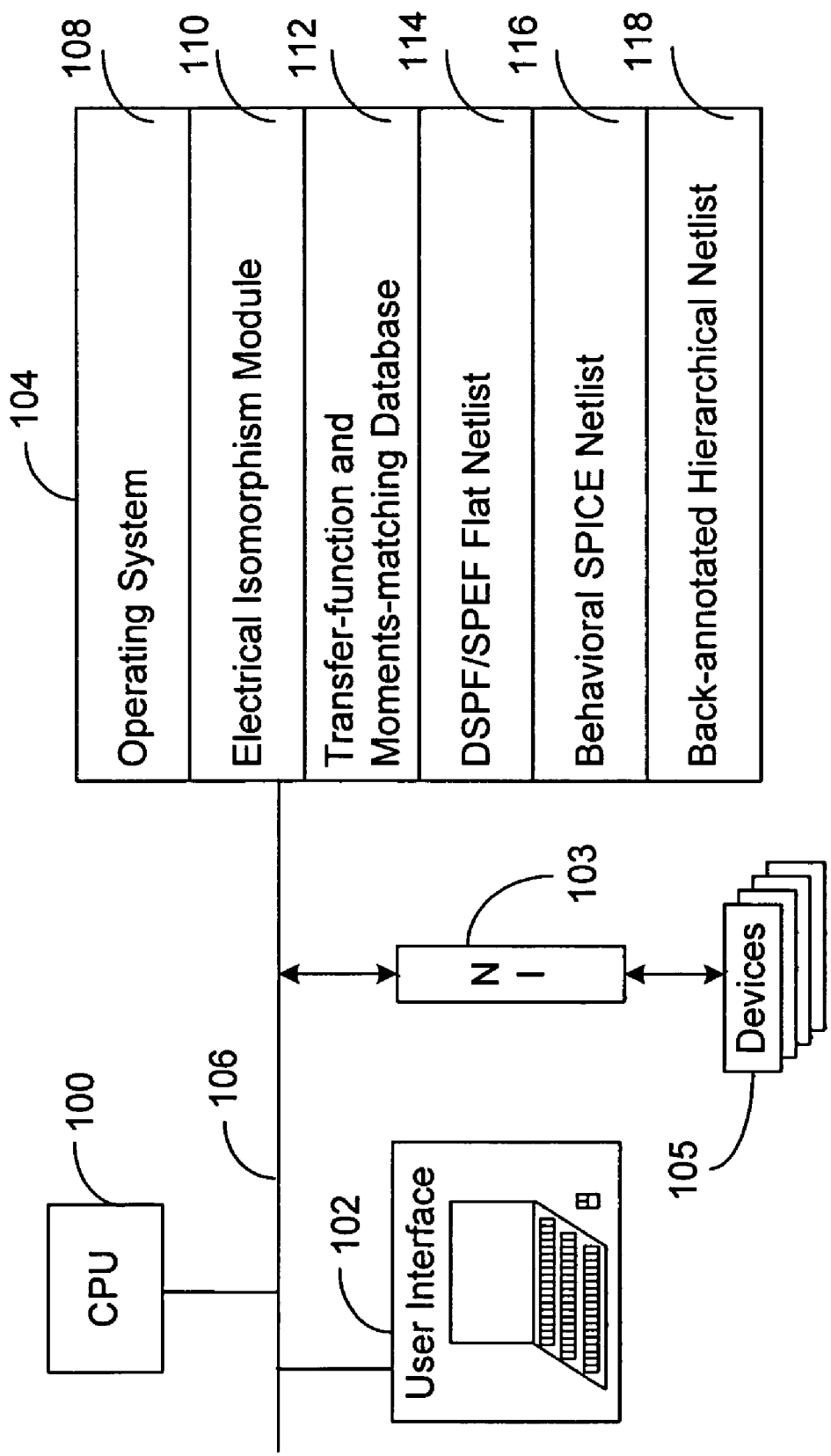
FIG. 1 illustrates a system for determining electrical isomorphism between two electrical networks according to an embodiment of the present invention.

In one embodiment, a system for determining electrical isomorphism between two electrical networks is implemented using a computer system schematically shown in FIG. 1. The computer system includes one or more central processing units (CPUs) 100, at least a user interface 102, a memory device 104, a system bus 106, and one or more bus interfaces for connecting the CPU, user interface, memory device, and system bus together. The computer system also includes at least one network interface 103 for communicating with other devices 105 on a computer network. In alternative embodiments, much of the functionality of the circuit simulator may be implemented in one or more application-specific integrated circuits or field-programmable gate arrays, thereby either eliminating the need for a CPU, or reducing the role of the CPU in simulating the integrated circuit.

The memory device 104 may include a high-speed random access memory or may also include a non-volatile memory, such as one or more magnetic disk storage devices. The memory device 104 may also include mass storages that are remotely located from the central process unit(s) 100. The memory device 104 preferably stores:

- an operating system 108 that includes procedures for handling various basic system services and for performing hardware-dependent tasks;
- an electrical isomorphism module 110, for determining electrical isomorphism between two electrical networks of an integrated circuit;
- transfer-function matrix and moments-matching database 112, for storing information for the transfer-function matrix and the moments-matching approaches;
- a DSPF/SPEF flat netlist 114;
- a behavioral SPICE netlist 116; and
- a back-annotated hierarchical netlist 118.

The electrical isomorphism module, transfer-function matrix and moments-matching database, DSPF/SPEF flat netlist, behavioral SPICE netlist, and back-annotated hierarchical netlist may include executable procedures, sub-modules, tables, and other data structures. In other embodiments, additional or different modules and data structures may be used, and some of the modules and/or data structures listed above may not be used.

In the following sections, two approaches are described for determining electrical isomorphism between two electrical networks of an integrated circuit, namely the transfer-function matrix approach and the moments-matching approach.

Transfer-Function Matrix Approach

In general, the transfer-function matrix approach obtains the transfer-function matrices at a predefined frequency from the two networks of interest and compares the elements of the corresponding matrices. For an electrical network represented by a n×n matrix, there are n×n comparisons. If each element from the first matrix is substantially equivalent to its corresponding element in the second matrix, the two electrical networks are considered as electrically isomorphic networks at this frequency. This process is repeated at other frequencies. If the two electrical networks are substantially equivalent at all frequencies, the two electrical networks are considered to be electrically isomorphic. In that case, a single representation of the two electrical networks is stored and used for simulation.

In one embodiment, the transfer-function matrix approach includes: (a) determining a first transfer-function matrix representing the first electrical network and a second transfer-function matrix representing the second electrical network respectively at a predefined frequency; (b) comparing corresponding elements of the first and second transfer-function matrices; (c) identifying the first and second electrical networks as electrically isomorphic networks at the predefined frequency, if the corresponding elements of the first and second transfer-function matrices are substantially equivalent within a predetermined tolerance range. The above procedures from (a) to (c) are repeated over a predetermined range of frequencies. If the first and second electrical networks are substantially equivalent over the predetermined range of frequencies, the first and second electrical networks are identified as electrically isomorphic networks over the predetermined range of frequencies.

Specifically, the method for determining a transfer-function matrix of an electrical network at the predefined frequency includes the following procedures for each port in the electrical network: (a) expressing a transfer-function relationship between the port with respect to other ports in the electrical network; (b) stimulating the port with a known input; and (c) determining transfer-function responses at other ports of the electrical network with respect to the known input. The above procedures from (a) to (c) are repeated for all ports of the electrical network. Then, the transfer-function matrix is constructed using the transfer-function responses determined.

Figure 2:
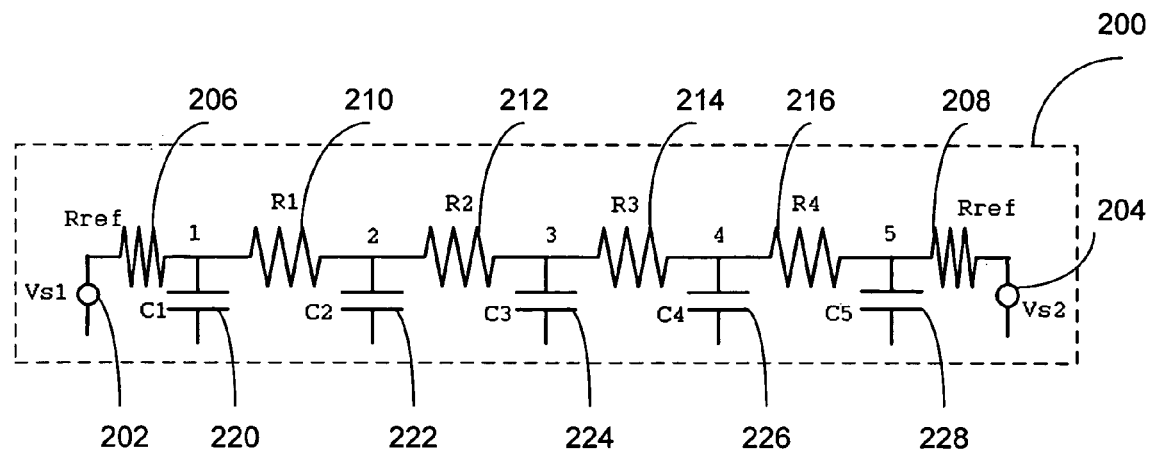
FIG. 2 is an RC network used to illustrate the transfer-function matrix approach according to an embodiment of the present invention.

FIG. 2 is an RC network used to illustrate the transfer-function matrix approach according to an embodiment of the present invention. The RC network 200 includes power supplies $V_{s1}$ 202 and $V_{s2}$ 204, reference resistors $R_{ref}$ 206 and $R_{ref}$ 208, resistors R1 210, R2 212, R3 214, and R4 216, and capacitors C1 220, C2 222, C3 224, C4 226, and C5 228. The RC network 200 also has 5 ports, namely ports 1, 2, 3, 4, and 5. Considering the electrical network as shown in FIG. 2, the matrix Y relates voltage (v) to current (i) by $$Yv=i.$$

Figure 3:
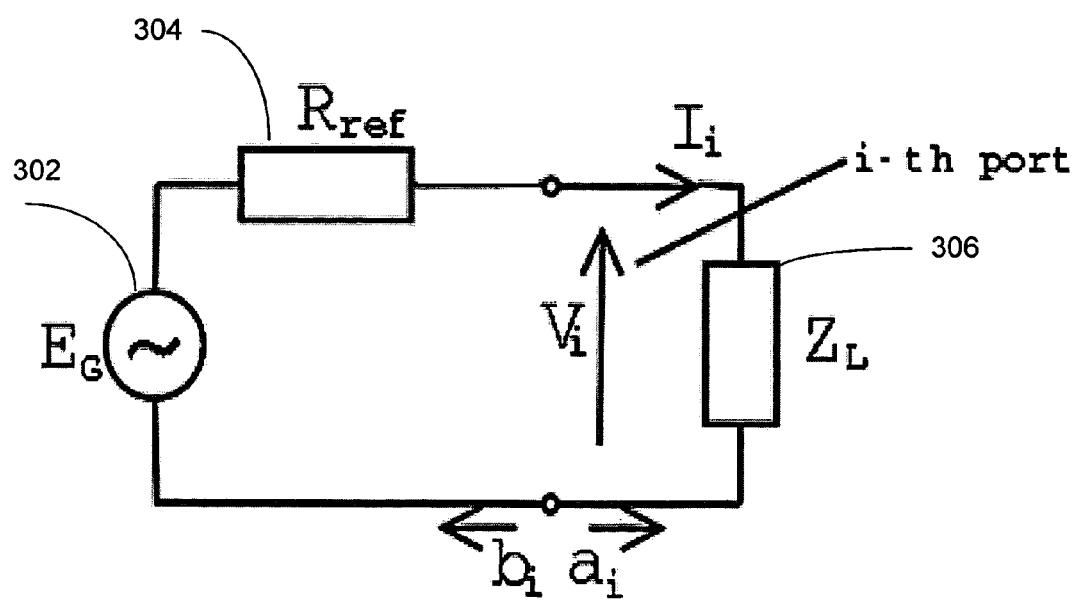
FIG. 3 illustrates a circuit representation of a port in the RC network of FIG. 2 according to an embodiment of the present invention.

FIG. 3 illustrates a circuit representation of a port in the RC network of FIG. 2 according to an embodiment of the present invention. Each port (port i) of the RC network of FIG. 2 may be modeled to include a power source $E_G$ 302, a reference-resistor $R_{ref}$ 304, and a load-impedance $Z_L$ 306. The voltage across the $Z_L$ 306 is $V_i$, and the current passing through the $Z_L$ is $I_i$. As shown in FIG. 3, the wave vectors $a_i$ and $b_i$ at the port i may be defined as $$a_i = \frac{V_i}{\sqrt{R_{ref}}} + \sqrt{R_{ref}}\, I_i, \text{ and}$$

$$b_i = \frac{V_i}{\sqrt{R_{ref}}} - \sqrt{R_{ref}}\, I_i;$$

where $V_i$ is the terminal voltage, $I_i$ is the terminal current, and $R_{ref}$ is an arbitrary reference resistance.

Next, extended wave vectors may be defined such that $$\hat{a}_i = a_i \text{ if node i is a port, otherwise } \hat{a}_i = I_i = (Yv)_i; \text{ and}$$

$$\hat{b}_i = b_i \text{ if node i is a port, otherwise } \hat{b}_i = I_i = (Yv)_i.$$

In this example, nodes 1 and 5 are ports and nodes 2, 3, and 4 are internal nodes. The procedures for computing the transfer-function matrix are described as follows.

First, define the matrix $$F = \begin{bmatrix} \frac{1}{\sqrt{R_{ref}}} & & & & \\ & 1 & & & \\ & & 1 & & \\ & & & 1 & \\ & & & & \frac{1}{\sqrt{R_{ref}}} \end{bmatrix}$$

i.e., $$F_{ii} = \frac{1}{\sqrt{R_{ref}}}$$

if i is a port, $F_{ij}=0$ if $i \neq j$, and $F_{ii}=1$ otherwise; and the matrix $$\overline{H} = \begin{bmatrix} \frac{1}{R_{ref}} & 0 & 0 & 0 & 0 \\ 0 & 0 & 0 & 0 & 0 \\ 0 & 0 & 0 & 0 & 0 \\ 0 & 0 & 0 & 0 & 0 \\ 0 & 0 & 0 & 0 & \frac{1}{R_{ref}} \end{bmatrix}$$

i.e., $$H_{ii} = \frac{1}{R_{ref}}$$

if i is a port, and $H_{ii}=0$ otherwise. Then, $$\hat{a} = \overline{F}^{-1}(\overline{H}+\overline{Y})v;$$

$$\hat{b} = \overline{F}^{-1}(\overline{H}-\overline{Y})v.$$

Solving for $\hat{b}$, $$\hat{b} = \overline{F}^{-1}(\overline{H}-\overline{Y})(\overline{H}+\overline{Y})^{-1}\overline{F}\hat{a}.$$

The transfer-function matrix ($\hat{S}$) may be written as $$\hat{S} = \overline{F}^{-1}(\overline{H}-\overline{Y})(\overline{H}+\overline{Y})^{-1}\overline{F} = \overline{F}^{-1}[2\overline{H}((\overline{H}+\overline{Y})^{-1}-\overline{I})]\overline{F},$$

where $\overline{I}$ is the identity matrix. Note that $(\overline{H}+\overline{Y})$ is equivalent to $(\overline{G}+s\overline{C})$, where s denotes a complex frequency $j\omega$, $\overline{C}$ denotes the capacitance matrix, and $\overline{G}$ denotes the conductance matrix.

For a given frequency $\omega$, the $\hat{S}$ matrix is calculated to characterize the electrical response of the network. To calculate the $\hat{S}$ matrix, a vector $r_i$ is constructed, whose entries are all zeros, except for the $i^{th}$ entry, which equals to 1. Then, the vector $$\hat{b}_i = \overline{F}^{-1}[2\overline{H}((\overline{G}+s\overline{C})^{-1}-\overline{I})]\overline{F}r_i$$

is computed by multiplying $r_i$ through $\hat{S}$. Note that since $r_i$ has a single entry of 1 in its $i^{th}$ entry, $\hat{b}_i$ is the $i^{th}$ column of $\hat{S}$. By repeating the process, the complete transfer-function matrix is obtained.

Next, all entries of vector $r_i$ are set to 0, except that the $i^{th}$ entry is set to 1, where i is the $i^{th}$ port. Then the following equation is solved $$(\overline{G}+s\overline{C})^T x_i = r_i,$$

where $(\ )^T$ represents the transpose of a matrix. For each input port j, compute $$c_{ji} = (r_j)^T x_i.$$

Then, $$S_{ii} = \frac{2c_{ii}}{R_{ref}} - 1;$$

and for $i \neq j$, $$S_{ij} = \frac{2c_{ji}}{R_{ref}}.$$

In the transfer-function matrix approach, the $\hat{S}$ matrices are calculated for the two electrical networks over a range of frequencies. The highest frequency of interest is determined by detecting the sharpest rising and falling edges of voltage and current sources. For example, if the shortest transition time is 0.1 ns, then the highest frequency is 10 GHz (1/0.1 ns). If the corresponding $\hat{S}$ matrices of the two electrical networks are within a predetermined tolerance, the two electrical networks are considered as electrically isomorphic networks, and a single representation of the two electrical networks is stored and used for simulation. Note that the predetermined tolerance may be a user-defined parameter. For example, a user-defined tolerance of 1% indicates that the values of the corresponding elements of the transfer-function matrices if the two electrical networks are within 1% of each other. A person of ordinary skill in the art would recognize that other user-defined parameters for setting the tolerance levels may be used according to the application and accuracy level of the simulation desired by the circuit designer.

Moments-matching Approach

In the moments-matching approach, the admittance matrices of two electrical networks, where the coefficients of the admittance matrices contain a sum of moments, are obtained. The corresponding coefficients of the admittance matrices are then compared to determine whether two electrical networks are electrically isomorphic networks.

In one embodiment, the moments-matching approach includes determining a first admittance matrix representing the first electrical network and a second admittance matrix representing the second electrical network respectively and then comparing corresponding elements of the first and second admittance matrices. If the corresponding elements of the first and second admittance matrices are substantially equivalent within a predetermined tolerance range, the first and second electrical networks are identified as electrically isomorphic networks.

In particular, the method represents a voltage of an unknown internal port as a function of voltages of known external supplies and a function of complex frequency (jw). The method for determining an admittance matrix of an electrical network further includes the following procedures for each known external supply: (a) providing a stimulus to the electrical network by turning on the known external supply at a predefined voltage and turning off other known external supplies; (b) measuring current responses at the unknown ports of the electrical network due to the stimulus in (a); and (c) repeating procedures (a) and (b) for all known external power supplies of the electrical network. Then, the method constructs the admittance matrix using the current responses determined from procedures (a) to (c) described above.

Figure 4:
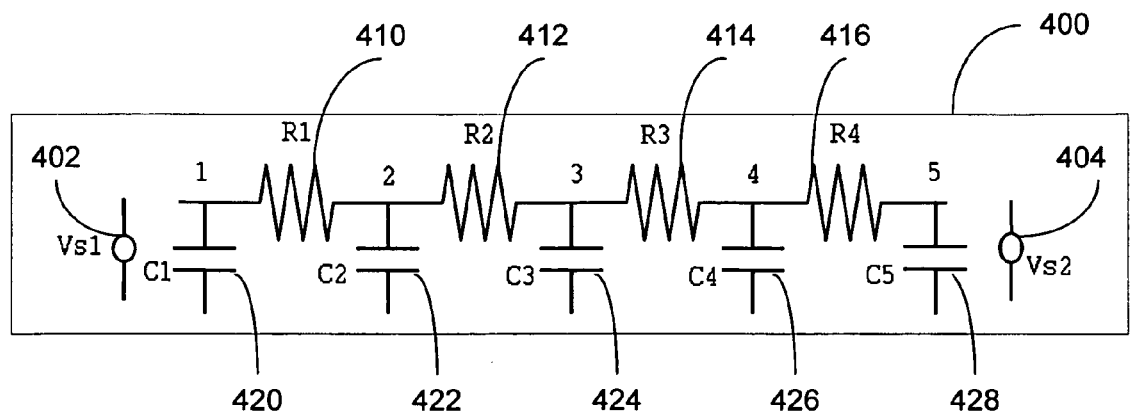
FIG. 4 is an RC network used to illustrate the moments-matching approach according to an embodiment of the present invention.

FIG. 4 is an RC network used to illustrate the moments-matching approach according to an embodiment of the present invention. The RC network 400 includes power supplies $V_{s1}$ 402 and $V_{s2}$ 404, resistors R1 410, R2 412, R3 414, and R4 416, and capacitors C1 420, C2 422, C3 424, C4 426, and C5 428. The RC network 400 also has 5 ports, namely ports 1, 2, 3, 4 and 5. In the moments-matching approach, the state variables (V) at zero frequency are expanded. The circuit equation of FIG. 4 may be written as $$\left(\begin{bmatrix} G_1+G_2 & -G_2 & \\ -G_2 & G_2+G_3 & -G_3 \\ & -G_3 & G_3+G_4 \end{bmatrix} + s\begin{bmatrix} C_2 & & \\ & C_3 & \\ & & C_4 \end{bmatrix}\right)$$

$$\begin{bmatrix} V_2 \\ V_3 \\ V_4 \end{bmatrix} = \begin{bmatrix} G_1 & 0 \\ 0 & 0 \\ 0 & G_4 \end{bmatrix}\begin{bmatrix} V_{s1} \\ V_{s2} \end{bmatrix}, \text{ with } G_i = \frac{1}{R_i}.$$

In the above equation, $V_2$, $V_3$, $V_4$ are functions of the complex frequency (s=jω), and $$V_2 = V_{2,0} + sV_{2,1} + s^2 V_{2,2} + \ldots + s^n V_{2,n},$$

$$V_3 = V_{3,0} + sV_{3,1} + s^2 V_{3,2} + \ldots + s^n V_{3,n},$$

$$V_4 = V_{4,0} + sV_{4,1} + s^2 V_{4,2} + \ldots + s^n V_{4,n},$$

where the first subscript represents a node number and the second subscript represents the ascending order of coefficient. In this example, n equals 2 because n cannot exceed the number of internal nodes minus 1. The order of expansion n affects the accuracy of calculation. In other embodiments, a number less than n may be chosen if the approximation meets desired design criteria.

Next, the matrix equation is solved by setting $V_{s1}=1$ and $V_{s2}=0$ for input port 1; and $V_{s2}=1$ and, $V_{s1}=0$ for input port 2. In other words, the RC network is stimulated by turning on one known external supply at a predefined voltage and turning off other known external supplies.

In matrix form, $$(\overline{G}+s\overline{C})\hat{v}=\hat{b};$$

$$\hat{v}=\hat{v}_0+s\hat{v}_1+s^2\hat{v}_2.$$

By equating the constant term and coefficients of s, $s^2$, ..., etc.

$$\hat{v}_0 = \overline{G}^{-1}\hat{b};$$

$$\hat{v}_1 = -\overline{G}^{-1}\overline{C}\hat{v}_0.$$

Then, the port currents are expressed in terms of the known voltages $$I_1 = V_{s1}(G_1+sC_1) - V_2 G_1;$$

$$I_2 = V_{s2}(G_4+sC_5) - V_4 G_4.$$

For input port 1, $V_2$ may be expressed as $$V_2 = V^1{}_{2,0} + sV^1{}_{2,1} + s^2 V^1{}_{2,2} + \ldots;$$

with the superscript i denotes the influence of input port i. The port current at port 1 due to input port 1 may be expressed as $$I_1^1 = G_1 - V_{2,0}^1 G_1 + s(C_1 - V_{2,1}^1 G_1) - s^2 V_{2,2}^1 G_1.$$

Similarly, $I_2^1$, $I_1^2$, $I_2^2$ are expressed as follows:

$$I_2^1 = -V_{4,0}^1 G_4 - sV_{4,1}^1 G_4 - s^2 V_{4,2}^1 G_4;$$

$$I_1^2 = -V_{2,0}^2 G_1 - sV_{2,1}^2 G_1 - s^2 V_{2,2}^2 G_1;$$

$$I_2^2 = G_4 - V_{4,0}^2 G_4 + s(C_5 - V_{4,1}^2) - s^2 V_{4,2}^2 G_4.$$

For n ports, the admittance matrix coefficients are obtained from $I_{1,\ldots,n}^{1,\ldots,n}$. Next, the two electrical networks are determined to be electrically isomorphic networks if the corresponding coefficients of the admittance matrices for the first few moments are within a predetermined tolerance. Note that the predetermined tolerance may be a user-defined parameter. For example, a user-defined tolerance of 1% indicates that the values of the corresponding admittance matrix coefficients of the two electrical networks are within 1% of each other. A person of ordinary skill in the art would recognize that other user-defined parameters for setting the tolerance levels may be used according to the application and accuracy level of the simulation desired by the circuit designer. If the sums of the moments of the corresponding elements of the two admittance matrices are substantially equivalent, a single representation of the two electrical networks is stored and used for simulation.

Figure 5:
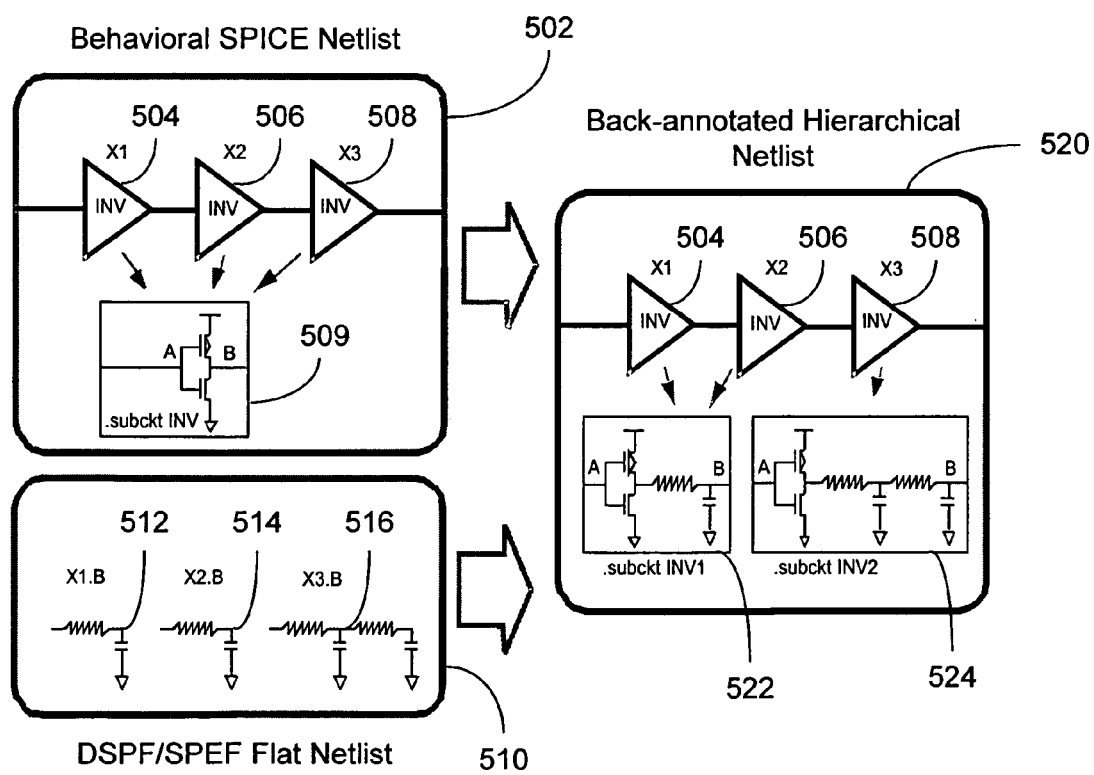
FIG. 5 illustrates a method for applying the technique of electrical isomorphism to improve circuit simulation efficiency according to an embodiment of the present invention.

FIG. 5 illustrates a method for applying the technique of electrical isomorphism to improve circuit simulation efficiency according to an embodiment of the present invention. As shown in FIG. 5, a behavioral SPICE netlist 502 and a DSPF/SPEF flat netlist 510 are merged into a back-annotated hierarchical netlist 520 containing back-annotated parasitic elements. A system and method for converting a flat netlist into a hierarchical netlist are described in U.S. patent application "System and Method for Converting a Flat Netlist into a Hierarchical Netlist." The entire content of the "System and Method for Converting a Flat Netlist into a Hierarchical Netlist" application is incorporated herein by reference.

The behavioral SPICE netlist 502 from the schematic has three instances of the same inverter (INV), namely X1 504, X2 506, and X3 508. The three inverters, namely X1, X2, and X3, refer to the same subcircuit INV 509. The DSPF/SPEF flat netlist 510 has three nets. Two of the nets X1.B 512 and X2.B 514 contain the same RC network while X3.B 516 contains a different RC network. The nets are grouped into sets of substantially equivalent subcircuits and then stitched to form the back-annotated hierarchical netlist 520. When the instances X1 and X2 are determined to receive the same net B, then they may share the same modified inverter primitive subcircuit INV1 522. The original INV primitive 509 is split into two subcircuits 522 and 524 so that X3 is separated from X1 and X2 with its own version of subcircuit INV2 524. In this example, X1 504 and X2 506 have an identical RC network as described by the subcircuit 522. The technique of electrical isomorphism may be applied in simulating the circuit of FIG. 5 that X1 and X2 may be represented by a single RC network even though they contain topologically different RC networks. Therefore, the method of electrical isomorphism improves the performance of circuit simulation because it reduces the number of circuit elements that have to be simulated. A person of ordinary skill in the art may recognize that the technique of electrical isomorphism may be applied before or after an RC Reduction.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. A method for simulating a circuit having a hierarchical data structure, comprising:
   representing the circuit as a hierarchically-arranged set of branches, including a root branch and a plurality of other branches logically organized in a graph; the hierarchically-arranged set of branches including a first branch that includes a first electrical network and a second branch that includes a second electrical network; wherein the first and second branches are interconnected in the graph through a third branch at a higher hierarchical level in the graph than the first and second branches;
   determining a first admittance matrix representing the first electrical network and a second admittance matrix representing the second electrical network respectively;
   comparing corresponding elements of the first and second admittance matrices;
   identifying the first and second electrical networks as electrically isomorphic networks in response to the corresponding elements of the first and second admittance matrices are substantially equivalent within a predetermined tolerance range;
   representing the first and second electrical networks with a single electrically isomorphic network in response to the first and second electrical networks are determined to be electrically isomorphic networks; and
   simulating the first and second electrical networks using the single electrically isomorphic network.

2. The method of claim 1, wherein the first electrical network includes a first (Resistor-Capacitor) RC network and the second electrical network includes a second RC networks.

3. The method of claim 2, wherein the first RC network and the second RC network have a same number of ports.

4. The method of claim 2, wherein the first RC network and the second RC network have a same number of RC elements.

5. The method of claim 2, wherein the first RC network and the second RC network have a different number of RC elements.

6. The method of claim 1 further comprising determining whether the first and second electrical networks are electrically isomorphic networks by:
   (a) determining a first transfer-function matrix representing the first electrical network and a second transfer-function matrix representing the second electrical network respectively at a predefined frequency;
   (b) comparing corresponding elements of the first and second transfer-function matrices;
   (c) identifying the first and second electrical networks as electrically isomorphic networks at the predefined frequency in response to the corresponding elements of the first and second transfer-function matrices are substantially equivalent within a predetermined tolerance range;
   repeating procedures (a) to (c) over a predetermined range of frequencies; and
   identifying the first and second electrical networks as electrically isomorphic networks over the predetermined range of frequencies in response to the first and second electrical networks are substantially equivalent over the predetermined range of frequencies.

7. The method of claim 6, wherein determining a transfer-function matrix representing an electrical network at the predefined frequency comprises:
   for each port in the electrical network,
   (a) expressing a transfer-function relationship between the port with respect to other ports in the electrical network;
   (b) stimulating the port with a known input;
   (c) determining transfer-function responses at other ports of the electrical network with respect to the known input;
   (d) repeating procedures (a) to (c) for all ports of the electrical network;
   constructing the transfer-function matrix using the transfer-function responses determined from procedures (a) to (d).

8. The method of claim 1, wherein determining an admittance matrix representing an electrical network comprises:
   representing a voltage of an unknown internal port as a function of voltages of known external supplies and a function of complex frequency (jw);
   for each known external supply,
   (a) providing a stimulus to the electrical network by turning on the known external supply at a predefined voltage and turning off other known external supplies;
   (b) measuring current responses at the unknown ports of the electrical network due to the stimulus in (a);
   (c) repeating procedures (a) and (b) for all known external power supplies of the electrical network;
   constructing the admittance matrix using the current responses determined from procedures (a) to (c).

9. A system for simulating a circuit having a hierarchical data structure, comprising:
   at least one processing unit for executing computer programs;
   a graphical-user-interface for viewing representations of the integrated circuit on a display;
   a memory for storing information of the integrated circuit;
   means for representing the circuit as a hierarchically-arranged set of branches, including a root branch and a plurality of other branches logically organized in a graph; the hierarchically-arranged set of branches including a first branch that includes a first electrical network and a second branch that includes a second electrical network; wherein the first and second branches are interconnected in the graph through a third branch at a higher hierarchical level in the graph than the first and second branches;

means for determining a first admittance matrix representing the first electrical network and a second admittance matrix representing the second electrical network respectively;

means for comparing corresponding elements of the first and second admittance matrices;

means for identifying the first and second electrical networks as electrically isomorphic networks in response to the corresponding elements of the first and second admittance matrices are substantially equivalent within a predetermined tolerance range;

means for representing the first and second electrical networks with a single electrically isomorphic network in response to the first and second electrical networks are determined to be electrically isomorphic networks; and means for simulating the first and second electrical networks using the single electrically isomorphic network.

10. The system of claim 9, wherein the first electrical network includes a first (Resistor-Capacitor) RC network and the second electrical network includes a second RC networks.

11. The system of claim 10, wherein the first RC network and the second RC network have a same number of ports.

12. The system of claim 10, wherein the first RC network and the second RC network have a same number of RC elements.

13. The system of claim 10, wherein the first RC network and the second RC network have a different number of RC elements.

14. The system of claim 9 further comprising the means for determining whether the first and second electrical networks are electrically isomorphic networks by:
(a) means for determining a first transfer-function matrix representing the first electrical network and a second transfer-function matrix representing the second electrical network respectively at a predefined frequency;
(b) means for comparing corresponding elements of the first and second transfer-function matrices;
(c) means for identifying the first and second electrical networks as electrically isomorphic networks at the predefined frequency in response to the corresponding elements of the first and second transfer-function matrices are substantially equivalent within a predetermined tolerance range;

means for repeating procedures (a) to (c) over a predetermined range of frequencies; and means for identifying the first and second electrical networks as electrically isomorphic networks over the predetermined range of frequencies in response to the first and second electrical networks are substantially equivalent over the predetermined range of frequencies.

15. The system of claim 14, wherein means for determining a transfer-function matrix representing an electrical network at the predefined frequency comprise:
for each port in the electrical network,
(a) means for expressing a transfer-function relationship between the port with respect to other ports in the electrical network;
(b) means for stimulating the port with a known input;
(c) means for determining transfer-function responses at other ports of the electrical network with respect to the known input;

(d) means for repeating procedures (a) to (c) for all ports of the electrical network;

means for constructing the transfer-function matrix using the transfer-function responses determined from procedures (a) to (d).

16. The system of claim 9, wherein means for determining an admittance matrix representing an electrical network comprise:
means for representing a voltage of an unknown internal port as a function of voltages of known external supplies and a function of complex frequency (jw);
for each known external supply,
(a) means for providing a stimulus to the electrical network by turning on the known external supply at a predefined voltage and turning off other known external supplies;
(b) means for measuring current responses at the unknown ports of the electrical network due to the stimulus in (a);
(c) means for repeating procedures (a) and (b) for all known external power supplies of the electrical network;

means for constructing the admittance matrix using the current responses determined from procedures (a) to (c).

17. A computer program product, comprising a medium storing programs for execution by one or more computer systems, the computer program product comprising:
an electrical isomorphism module for identifying electrically isomorphic networks, wherein the electrical isomorphism module is used in conjunction with at least a microprocessor unit, a memory, and a user interface, and the electrical isomorphism module includes one or more computer programs containing instructions for;
representing the circuit as a hierarchically-arranged set of branches, including a root branch and a plurality of other branches logically organized in a graph; the hierarchically-arranged set of branches including a first branch that includes a first electrical network and a second branch that includes a second electrical network; wherein the first and second branches are interconnected in the graph through a third branch at a higher hierarchical level in the graph than the first and second branches;
(a) determining a first transfer-function matrix representing the first electrical network and a second transfer-function matrix representing the second electrical network respectively at a predefined frequency;
(b) comparing corresponding elements of the first and second transfer-function matrices;
(c) identifying the first and second electrical networks as electrically isomorphic networks at the predefined frequency in response to the corresponding elements of the first and second transfer-function matrices are substantially equivalent within a predetermined tolerance range;
repeating procedures (a) to (c) over a predetermined range of frequencies;
identifying the first and second electrical networks as electrically isomorphic networks over the predetermined range of frequencies in response to the first and second electrical networks are substantially equivalent over the predetermined range of frequencies;
representing the first and second electrical networks with a single electrically isomorphic network in response to the first and second electrical networks are determined to be electrically isomorphic networks; and simulating the first and second electrical networks using the single electrically isomorphic network.

18. The computer program product of claim 17, wherein the first electrical network includes a first (Resistor-Capacitor) RC network and the second electrical network includes a second RC networks.

19. The computer program product of claim 18, wherein the first RC network and the second RC network have a same number of ports.

20. The computer program product of claim 18, wherein the first RC network and the second RC network have a same number of RC elements.

21. The computer program product of claim 18, wherein the first RC network and the second RC network have a different number of RC elements.

22. The computer program product of claim 17, wherein the instructions for determining a transfer-function matrix representing an electrical network at the predefined frequency comprise:
for each port in the electrical network,
(a) expressing a transfer-function relationship between the port with respect to other ports in the electrical network;
(b) stimulating the port with a known input;
(c) determining transfer-function responses at other ports of the electrical network with respect to the known input;
(d) repeating procedures (a) to (c) for all ports of the electrical network;
constructing the transfer-function matrix using the transfer-function responses determined from procedures (a) to (d).

23. The computer program product of claim 17, further comprising instructions for determining whether the first and second electrical networks are electrically isomorphic networks by:
determining a first admittance matrix representing the first electrical network and a second admittance matrix representing the second electrical network respectively;
comparing corresponding elements of the first and second admittance matrices; and
identifying the first and second electrical networks as electrically isomorphic networks in response to the corresponding elements of the first and second admittance matrices are substantially equivalent within a predetermined tolerance range.

24. The computer program product of claim 23, wherein the instructions for determining an admittance matrix representing an electrical network comprise:
representing a voltage of an unknown internal port as a function of voltages of known external supplies and a function of complex frequency (jw);
for each known external supply,
(a) providing a stimulus to the electrical network by turning on the known external supply at a predefined voltage and turning off other known external supplies;
(b) measuring current responses at the unknown ports of the electrical network due to the stimulus in (a);
(c) repeating procedures (a) and (b) for all known external power supplies of the electrical network;
constructing the admittance matrix using the current responses determined from procedures (a) to (c).

* * * * *